US011929199B2

(12) United States Patent
Flemming et al.

(10) Patent No.: US 11,929,199 B2
(45) Date of Patent: Mar. 12, 2024

(54) 2D AND 3D INDUCTORS FABRICATING PHOTOACTIVE SUBSTRATES

(71) Applicant: 3D Glass Solutions, Inc., Albuquerque, NM (US)

(72) Inventors: Jeb H. Flemming, Albuquerque, NM (US); Jeff Bullington, Orlando, FL (US); Roger Cook, Albuquerque, NM (US); Kyle McWethy, Albuquerque, NM (US)

(73) Assignee: 3D GLASS SOLUTIONS, INC., Albuquerque, NM (US)

( * ) Notice: Subject to any disclaimer, the term of this patent is extended or adjusted under 35 U.S.C. 154(b) by 537 days.

(21) Appl. No.: 16/850,571

(22) Filed: Apr. 16, 2020

(65) Prior Publication Data

US 2020/0243248 A1    Jul. 30, 2020

Related U.S. Application Data

(63) Continuation of application No. 15/308,583, filed as application No. PCT/US2015/029222 on May 5, 2015, now Pat. No. 10,665,377.
(Continued)

(51) Int. Cl.
*H01F 27/28*    (2006.01)
*H01F 17/00*    (2006.01)
(Continued)

(52) U.S. Cl.
CPC ..... *H01F 27/2804* (2013.01); *H01F 17/0013* (2013.01); *H01F 41/041* (2013.01);
(Continued)

(58) Field of Classification Search
CPC ............ H01F 17/0013; H01F 27/2804; H01F 41/041; H01F 41/042; H01F 41/122; H01F 2027/2809; H05K 3/0023; H05K 3/107

See application file for complete search history.

(56) References Cited

U.S. PATENT DOCUMENTS 2,515,937 A    12/1943  Stookey
2,515,943 A    1/1949   Stookey
(Continued)

FOREIGN PATENT DOCUMENTS

CN    1562831 A      4/2004
CN    105047558 A    11/2015
(Continued)

OTHER PUBLICATIONS

European Search Report and Supplemental European Search Report for EP 19861556.9 dated Jan. 18, 2022, 9 pp.
(Continued)

*Primary Examiner* — Jeffrey T Carley
*Assistant Examiner* — Jose K Abraham
(74) *Attorney, Agent, or Firm* — Edwin S. Flores; Daniel J. Chalker; Chalker Flores, LLP

(57) ABSTRACT

A method of fabrication and device made by preparing a photosensitive glass substrate comprising at least silica, lithium oxide, aluminum oxide, and cerium oxide, masking a design layout comprising one or more holes to form one or more electrical conduction paths on the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-
(Continued)

crystalline substrate and etching the glass-crystalline substrate with an etchant solution to form one or more angled channels that are then coated.

5 Claims, 6 Drawing Sheets

Related U.S. Application Data

(60) Provisional application No. 61/988,615, filed on May 5, 2014.

(51) Int. Cl.
*H01F 41/04* (2006.01)
*H01F 41/12* (2006.01)
*H05K 3/00* (2006.01)
*H05K 3/10* (2006.01)

(52) U.S. Cl.
CPC ......... *H01F 41/042* (2013.01); *H01F 41/122* (2013.01); *H01F 2027/2809* (2013.01); *H05K 3/0023* (2013.01); *H05K 3/107* (2013.01)

(56) References Cited

U.S. PATENT DOCUMENTS

| | | | |
|---|---|---|---|
| 2,515,940 A | 7/1950 | Stookey | |
| 2,515,941 A | 7/1950 | Stookey | |
| 2,628,160 A | 2/1953 | Stookey | |
| 2,684,911 A | 7/1954 | Stookey | |
| 2,971,853 A | 2/1961 | Stookey | |
| 3,281,264 A | 10/1966 | Cape et al. | |
| 3,292,115 A | 12/1966 | Rosa | |
| 3,904,991 A | 9/1975 | Ishli et al. | |
| 3,985,531 A | 10/1976 | Grossman | |
| 3,993,401 A | 11/1976 | Strehlow | |
| 4,029,605 A | 6/1977 | Kosiorek | |
| 4,413,061 A | 11/1983 | Kumar | |
| 4,444,616 A | 4/1984 | Fujita et al. | |
| 4,514,053 A | 4/1985 | Borelli et al. | |
| 4,537,612 A | 8/1985 | Borelli et al. | |
| 4,611,882 A * | 9/1986 | Ushida | H05K 1/162 |
| | | | 361/306.2 |
| 4,647,940 A | 3/1987 | Traut et al. | |
| 4,692,015 A | 9/1987 | Loce et al. | |
| 4,788,165 A | 11/1988 | Fong et al. | |
| 4,942,076 A | 7/1990 | Panicker et al. | |
| 5,078,771 A | 1/1992 | Wu | |
| 5,147,740 A | 9/1992 | Robinson | |
| 5,212,120 A | 5/1993 | Araujo et al. | |
| 5,215,610 A | 6/1993 | Dipaolo et al. | |
| 5,312,674 A * | 5/1994 | Haertling | H05K 1/165 |
| | | | 428/209 |
| 5,352,996 A | 10/1994 | Kawaguchi | |
| 5,371,466 A | 12/1994 | Arakawa et al. | |
| 5,374,291 A | 12/1994 | Yabe et al. | |
| 5,395,498 A | 3/1995 | Gombinsky et al. | |
| 5,409,741 A | 4/1995 | Laude | |
| 5,733,370 A | 3/1998 | Chen et al. | |
| 5,779,521 A | 7/1998 | Muroyama et al. | |
| 5,850,623 A | 12/1998 | Carman, Jr. et al. | |
| 5,902,715 A | 5/1999 | Tsukamoto et al. | |
| 5,919,607 A | 7/1999 | Lawandy et al. | |
| 5,998,224 A | 12/1999 | Rohr et al. | |
| 6,046,641 A | 4/2000 | Chawla et al. | |
| 6,066,448 A | 5/2000 | Wohlstadter et al. | |
| 6,094,336 A | 7/2000 | Weekamp | |
| 6,136,210 A | 10/2000 | Biegelsen et al. | |
| 6,171,886 B1 | 1/2001 | Ghosh | |
| 6,258,497 B1 | 7/2001 | Kropp et al. | |
| 6,287,965 B1 | 9/2001 | Kang et al. | |
| 6,329,702 B1 | 12/2001 | Gresham et al. | |
| 6,373,369 B2 | 4/2002 | Huang et al. | |
| 6,383,566 B1 | 5/2002 | Zagdoun | |
| 6,417,754 B1 | 7/2002 | Bernhardt et al. | |
| 6,485,690 B1 | 11/2002 | Pfost et al. | |
| 6,495,411 B1 | 12/2002 | Mei | |
| 6,511,793 B1 | 1/2003 | Cho et al. | |
| 6,514,375 B2 | 2/2003 | Kijima | |
| 6,562,523 B1 | 2/2003 | Wu et al. | |
| 6,678,453 B2 | 1/2004 | Bellman et al. | |
| 6,686,824 B1 | 2/2004 | Yamamoto et al. | |
| 6,771,860 B2 | 8/2004 | Trezza et al. | |
| 6,783,920 B2 | 8/2004 | Livingston et al. | |
| 6,824,974 B2 | 11/2004 | Pisharody et al. | |
| 6,830,221 B1 | 12/2004 | Janson et al. | |
| 6,843,902 B1 | 1/2005 | Penner et al. | |
| 6,875,544 B1 | 4/2005 | Sweatt et al. | |
| 6,932,933 B2 | 8/2005 | Halvajian et al. | |
| 6,977,722 B2 | 12/2005 | Wohlstadter et al. | |
| 7,033,821 B2 | 4/2006 | Kim et al. | |
| 7,064,045 B2 | 6/2006 | Yang | |
| 7,132,054 B1 | 11/2006 | Kravitz et al. | |
| 7,179,638 B2 | 2/2007 | Anderson | |
| 7,277,151 B2 | 10/2007 | Ryu et al. | |
| 7,306,689 B2 | 12/2007 | Okubora et al. | |
| 7,326,538 B2 | 2/2008 | Pitner et al. | |
| 7,407,768 B2 | 8/2008 | Yamazaki et al. | |
| 7,410,763 B2 | 8/2008 | Su et al. | |
| 7,439,128 B2 | 10/2008 | Divakaruni | |
| 7,470,518 B2 | 12/2008 | Chiu et al. | |
| 7,497,554 B2 | 3/2009 | Okuno | |
| 7,603,772 B2 | 10/2009 | Farnsworth et al. | |
| 7,915,076 B2 * | 3/2011 | Ogawa | H01L 23/147 |
| | | | 438/106 |
| 7,948,342 B2 | 5/2011 | Long | |
| 8,062,753 B2 | 11/2011 | Schreder et al. | |
| 8,076,162 B2 | 12/2011 | Flemming et al. | |
| 8,096,147 B2 | 1/2012 | Flemming et al. | |
| 8,361,333 B2 | 1/2013 | Flemming et al. | |
| 8,492,315 B2 | 7/2013 | Flemming et al. | |
| 8,709,702 B2 | 4/2014 | Flemming et al. | |
| 9,385,083 B1 | 7/2016 | Herrault et al. | |
| 9,449,753 B2 | 9/2016 | Kim | |
| 9,635,757 B1 | 4/2017 | Chen et al. | |
| 9,755,305 B2 | 9/2017 | Desclos et al. | |
| 9,819,991 B1 | 11/2017 | Rajagopalan et al. | |
| 9,843,083 B2 | 12/2017 | Cooper et al. | |
| 10,070,533 B2 | 9/2018 | Flemming et al. | |
| 11,524,807 B2 | 12/2022 | Gentili et al. | |
| 2001/0051584 A1 | 12/2001 | Harada et al. | |
| 2002/0015546 A1 | 2/2002 | Bhagavatula | |
| 2002/0086246 A1 | 7/2002 | Lee | |
| 2002/0100608 A1 | 8/2002 | Fushie et al. | |
| 2003/0025227 A1 | 2/2003 | Daniell | |
| 2003/0107459 A1 | 6/2003 | Takahashi et al. | |
| 2003/0124716 A1 | 7/2003 | Hess et al. | |
| 2003/0135201 A1 | 7/2003 | Gonnelli | |
| 2003/0143802 A1 | 7/2003 | Chen et al. | |
| 2003/0156819 A1 | 8/2003 | Pruss et al. | |
| 2003/0174944 A1 | 9/2003 | Dannoux | |
| 2003/0228682 A1 | 12/2003 | Lakowicz et al. | |
| 2003/0231076 A1 | 12/2003 | Takeuchi et al. | |
| 2003/0231830 A1 | 12/2003 | Hikichi | |
| 2004/0008391 A1 | 1/2004 | Bowley et al. | |
| 2004/0020690 A1 | 2/2004 | Parker et al. | |
| 2004/0058504 A1 | 3/2004 | Kellar et al. | |
| 2004/0104449 A1 | 6/2004 | Yoon | |
| 2004/0155748 A1 | 8/2004 | Steingroever | |
| 2004/0171076 A1 | 9/2004 | Dejneka et al. | |
| 2004/0184705 A1 | 9/2004 | Shimada et al. | |
| 2004/0198582 A1 | 10/2004 | Borrelli et al. | |
| 2004/0227596 A1 | 11/2004 | Nguyen et al. | |
| 2005/0089901 A1 | 4/2005 | Porter et al. | |
| 2005/0105860 A1 | 5/2005 | Oono | |
| 2005/0111162 A1 | 5/2005 | Osaka et al. | |
| 2005/0118779 A1 | 6/2005 | Ahn | |
| 2005/0150683 A1 | 7/2005 | Farnworth et al. | |
| 2005/0170670 A1 | 8/2005 | King et al. | |
| 2005/0194628 A1 | 9/2005 | Kellar et al. | |
| 2005/0212432 A1 | 9/2005 | Neil et al. | |
| 2005/0277550 A1 | 12/2005 | Brown et al. | |
| 2006/0092079 A1 | 5/2006 | Rochemont | |

(56) References Cited

U.S. PATENT DOCUMENTS

| | | |
|---|---|---|
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0201201 A1 | 9/2006 | Fushie et al. |
| 2006/0283948 A1 | 12/2006 | Naito |
| 2007/0023386 A1 | 2/2007 | Kravitz et al. |
| 2007/0034910 A1* | 2/2007 | Shie .............. C25D 5/48 257/E21.022 |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0254490 A1* | 11/2007 | Jain ............... G02F 1/1362 257/E21.258 |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0290782 A1* | 12/2007 | Yokoyama ........ H01L 24/97 336/200 |
| 2007/0296520 A1 | 12/2007 | Hosokawa et al. |
| 2008/0042785 A1 | 2/2008 | Yagisawa |
| 2008/0079565 A1 | 4/2008 | Koyama |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0231402 A1 | 9/2008 | Jow et al. |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0200540 A1 | 8/2009 | Bjoerk et al. |
| 2009/0243783 A1 | 10/2009 | Fouquet et al. |
| 2009/0290281 A1 | 11/2009 | Nagamoto et al. |
| 2010/0009838 A1 | 1/2010 | Muraki |
| 2010/0022416 A1 | 1/2010 | Flemming et al. |
| 2010/0044089 A1 | 2/2010 | Shibuya et al. |
| 2010/0059265 A1 | 3/2010 | Myung-Soo |
| 2010/0194511 A1* | 8/2010 | Kobayashi ........ H01F 27/34 336/83 |
| 2010/0237462 A1 | 9/2010 | Beker et al. |
| 2011/0003422 A1* | 1/2011 | Katragadda ......... B81C 1/0023 257/E21.532 |
| 2011/0045284 A1 | 2/2011 | Matsukawa et al. |
| 2011/0065662 A1 | 3/2011 | Rinsch et al. |
| 2011/0084371 A1 | 4/2011 | Rotay et al. |
| 2011/0086606 A1 | 4/2011 | Chen et al. |
| 2011/0108525 A1 | 5/2011 | Chien et al. |
| 2011/0114496 A1 | 5/2011 | Dopp et al. |
| 2011/0115051 A1 | 5/2011 | Kim et al. |
| 2011/0170273 A1 | 7/2011 | Helvajian |
| 2011/0195360 A1* | 8/2011 | Flemming ........ G03F 7/0043 430/323 |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0015578 A1 | 1/2013 | Thacker et al. |
| 2013/0105941 A1 | 5/2013 | Vanslette et al. |
| 2013/0119401 A1 | 5/2013 | D'Evelyn et al. |
| 2013/0142998 A1 | 6/2013 | Flemming et al. |
| 2013/0143381 A1* | 6/2013 | Kikukawa ........ H01L 28/10 336/200 |
| 2013/0183805 A1 | 7/2013 | Wong et al. |
| 2013/0207745 A1* | 8/2013 | Yun ............... H03H 7/09 333/175 |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0104288 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0306653 A1* | 10/2014 | Hirobe ........... H02J 50/10 320/108 |
| 2014/0367695 A1 | 12/2014 | Barlow |
| 2015/0035638 A1* | 2/2015 | Stephanou ....... H01F 41/041 336/200 |
| 2015/0048901 A1 | 2/2015 | Rogers |
| 2015/0071593 A1 | 3/2015 | Kanke |
| 2015/0210074 A1 | 7/2015 | Chen et al. |
| 2015/0228712 A1 | 8/2015 | Yun |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1 | 6/2016 | Fushie |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2017/0370870 A1 | 12/2017 | Fomina et al. |
| 2018/0310399 A1 | 10/2018 | Nair et al. |
| 2018/0315811 A1 | 11/2018 | Cho et al. |
| 2018/0323485 A1 | 11/2018 | Gnanou et al. |
| 2019/0280079 A1 | 7/2019 | Bouvier et al. |
| 2020/0060513 A1 | 2/2020 | To et al. |
| 2020/0066443 A1 | 2/2020 | Lu et al. |
| 2020/0119255 A1 | 4/2020 | Then et al. |
| 2020/0168536 A1 | 5/2020 | Link et al. |
| 2020/0211985 A1 | 7/2020 | Pietambaram et al. |
| 2020/0227470 A1 | 7/2020 | Then et al. |
| 2020/0235020 A1 | 7/2020 | Boek |
| 2020/0252074 A1 | 8/2020 | Healy et al. |
| 2020/0275558 A1 | 8/2020 | Fujita |
| 2021/0013303 A1 | 1/2021 | Chen et al. |
| 2021/0271275 A1 | 9/2021 | Kim et al. |

FOREIGN PATENT DOCUMENTS

| | | |
|---|---|---|
| CN | 105938928 | 9/2016 |
| CN | 210668058 U | 6/2020 |
| DE | 102004059252 A1 | 1/2006 |
| EP | 0311274 A1 | 12/1989 |
| EP | 0507719 A1 | 10/1992 |
| EP | 0685857 B1 | 12/1995 |
| EP | 0949648 A1 | 10/1999 |
| EP | 1487019 A1 | 12/2004 |
| EP | 1683571 A1 | 6/2006 |

(56) References Cited

FOREIGN PATENT DOCUMENTS

| | | | |
|---|---|---|---|
| GB | 619779 | A | 3/1949 |
| GB | 1407151 | | 9/1975 |
| JP | 56-155587 | | 12/1981 |
| JP | 61149905 | | 7/1986 |
| JP | 61231529 | A | 10/1986 |
| JP | 62202840 | A | 9/1987 |
| JP | 63-128699 | A | 6/1988 |
| JP | 08026767 | A | 6/1988 |
| JP | H393683 | A | 4/1991 |
| JP | 05139787 | A | 6/1993 |
| JP | 08179155 | A | 12/1994 |
| JP | 10007435 | A | 1/1998 |
| JP | 10-199728 | A * | 7/1998 |
| JP | 10199728 | A | 7/1998 |
| JP | 11344648 | A | 12/1999 |
| JP | 2000114818 | A | 4/2000 |
| JP | 2000228615 | A | 8/2000 |
| JP | 2001033664 | A | 2/2001 |
| JP | 2001206735 | A | 7/2001 |
| JP | 2001284533 | A | 10/2001 |
| JP | 2005-302987 | A * | 10/2005 |
| JP | 2005302987 | A | 10/2005 |
| JP | 2005215644 | A | 11/2005 |
| JP | 2006032982 | A | 2/2006 |
| JP | 2006179564 | A | 6/2006 |
| JP | 2006324489 | A | 11/2006 |
| JP | 2008252797 | A | 10/2008 |
| JP | 2011192836 | A | 9/2011 |
| JP | 2012079960 | A | 4/2012 |
| JP | 2013062473 | A | 4/2013 |
| JP | 2013217989 | A | 10/2013 |
| JP | 2014241365 | A | 12/2014 |
| JP | 2015028651 | | 2/2015 |
| JP | 2015028651 | A | 2/2015 |
| JP | H08026767 | A | 1/2016 |
| JP | 2018200912 | A | 12/2018 |
| JP | 2021145131 | A | 9/2021 |
| KR | 1020040001906 | B1 | 1/2004 |
| KR | 1020050000923 | | 1/2005 |
| KR | 20060092643 | A | 8/2006 |
| KR | 100941691 | B1 | 2/2010 |
| KR | 101167691 | B1 | 7/2012 |
| KR | 101519760 | | 5/2015 |
| WO | 2005027606 | A1 | 3/2005 |
| WO | 2007088058 | A2 | 8/2007 |
| WO | 2008119080 | A1 | 10/2008 |
| WO | 2008154931 | A1 | 12/2008 |
| WO | 2009029733 | A2 | 3/2009 |
| WO | 2009062011 | A1 | 5/2009 |
| WO | 2009126649 | A2 | 10/2009 |
| WO | 2010011939 | A2 | 1/2010 |
| WO | 2011/100445 | A1 * | 8/2011 |
| WO | 2011100445 | A1 | 8/2011 |
| WO | 2011109648 | A1 | 9/2011 |
| WO | 2012078213 | A1 | 6/2012 |
| WO | 2014062226 | A1 | 1/2014 |
| WO | 2014043267 | A1 | 3/2014 |
| WO | 2014062311 | A1 | 4/2014 |
| WO | 2014193525 | A1 | 12/2014 |
| WO | 2015108648 | A1 | 7/2015 |
| WO | 2015112903 | A1 | 7/2015 |
| WO | 2015171597 | A1 | 11/2015 |
| WO | 2017132280 | A2 | 8/2017 |
| WO | 2017147511 | A1 | 8/2017 |
| WO | 2017177171 | A1 | 10/2017 |
| WO | 2018200804 | A1 | 1/2018 |
| WO | 2018209422 | A1 | 11/2018 |
| WO | 2019010045 | A1 | 1/2019 |
| WO | 2019118761 | A1 | 6/2019 |
| WO | 2019136024 | A1 | 7/2019 |
| WO | 2019199470 | A1 | 10/2019 |
| WO | 2019231947 | A1 | 12/2019 |

OTHER PUBLICATIONS

European Search Report and Supplemental European Search Report for EP 19905255.6 dated Jul. 26, 2022, 8 pp.
OPTICS 101, "What is a Halogen Lamp?", Apr. 25, 2014, p. 1-2.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
Dang, et al. "Integrated thermal-fluidic I/O interconnects for an on-chip microchannel heat sink," IEEE Electron Device etters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17744848.7 dated Oct. 30, 2019, 9 pp.
Extended European Search Report 17757365.6 dated Oct. 14, 2019, 14 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.

(56) References Cited

OTHER PUBLICATIONS

International Search Report and Written Opinion for PCT/US2019/50644 dated Dec. 4, 2019 by USPTO, 9 pp.
International Technology Roadmap for Semiconductors, 2007 Edition, "Assembly and Packaging," 9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Akowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion—Templated Polymer Scaffolds, Chem Mater (2004), 16:4245-4256.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
Aslan, et al., "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al., "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
International Search Report and Written Opinion for PCT/US2020/28474 dated Jul. 17, 2020 by the USPTO, 7 pp.
Grine, F et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
International Search Report and Written Opinion for PCT/US2020/026673 dated Jun. 22, 2020, by the USPTO, 13 pp.
Mohamedelhassan, A., "Fabrication of Ridge Waveguides in Lithium Niobate," Independent thesis Advanced evel, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
International Search Report and Written Opinion for PCT/US2021/21371 dated May 20, 2021 by the USPTO, 10 pp.
Extended European Search Report for EP 19906040.1 dated Feb. 4, 2022, 16 pp.
Extended European Search Report for EP 20792242.8 dated May 3, 2022, 10 pp.
Kim, Dongsu, et al., "A Compact and Low-profile GaN Power Amplifier Using Interposer-based MMCI Technology," 2014 IEEE 16th Electronics Packaging Technology Conference, pp. 672-675.
International Search Report and Written Opinion for PCT/US2021/27499 dated Jun. 16, 2021 by the USPTO, 7 pp.
European Search Report and Supplemental European Search Report for EP 19905255.6 dated Aug. 4, 2022, 8 pp.
European Search Report and Supplemental European Search Report for EP 20783596.8 dated Oct. 26, 2022, 13 pp.
European Search Report and Supplemental European Search Report for EP 20877664.1 dated Oct. 28, 2022, 10 pp.
Flemming, J.H., et al., "Cost Effective 3D Glass Microfabrication for Advanced RF Packages," Microwave Journal, Apr. 14, 2014, 12 pp.
Foster, T., "High-Q RF Devices in APEX Glass," Jun. 21, 2018, https://nanopdf.com/download/high-q-rf-devices-in-apex-glass_pdf, retrieved on Oct. 3, 2022, 8 pp.
International Search Report and Written Opinion for PCT/US2022/31993 dated Sep. 9, 2022 by the USPTO, 9 pp.
International Search Report and Written Opinion for PCT/US2022/29442 dated Oct. 6, 2022 by the USPTO, 20 pp.
International Search Report and Written Opinion for PCT/US2022/42516 dated Feb. 3, 2023 by the USPTO, 22 pp.
International Search Report and Written Opinion for PCT/US2023/010118 dated Apr. 5, 2023 by the USPTO, 12 pp.
Supplementary European Search Repor for EP 21768296.2 dated May 5, 2023, 10 pp.
European Search Report and Supplemental European Search Report for EP 21787618.4 dated Jul. 28, 2023, 10 pp.
International Search Report and Written Opinion for PCT/US2023/064364 dated Sep. 27, 2023, by USPTO 11 ps.

(56) References Cited

OTHER PUBLICATIONS

International Search Report and Written Opinion for PCT/US2023/17311 dated Aug. 14, 2023 by the USPTO, 16 pp.

* cited by examiner

2D AND 3D INDUCTORS FABRICATING PHOTOACTIVE SUBSTRATES

CROSS-REFERENCE TO RELATED APPLICATIONS

This application is a continuation of U.S. application Ser. No. 15/308,583 filed on Nov. 2, 2016, which is a U.S. 371 National Phase Application from PCT International Serial No. PCT/US2015/029222 filed on May 5, 2015, and entitled "2D and 3D Inductors Antenna and Transformers Fabricating Photoactive Substrates," and claims benefit of U.S. Provisional Application Ser. No. 61/988,615, filed on May 5, 2014.

FIELD OF INVENTION

The present invention relates to creating an inductive current device in a photo definable glass structure, in particular, creating Inductors, Antenna, and Transformers devices and arrays in glass ceramic substrates for electronic, microwave and radio frequency in general.

Photosensitive glass structures have been suggested for a number of micromachining and microfabrication processes such as integrated electronic elements in conjunction with other elements systems or subsystems.

Silicon microfabrication of traditional glass is expensive and low yield while injection modeling or embossing processes produce inconsistent shapes. Silicon microfabrication processes rely on expensive capital equipment; photolithography and reactive ion etching or ion beam milling tools that generally cost in excess of one million dollars each and require an ultra-clean, high-production silicon fabrication facility costing millions to billions more. Injection molding and embossing are less costly methods of producing a three dimensional shapes but generate defects with in the transfer or have differences due to the stochastic curing process.

SUMMARY OF INVENTION

The present invention provides creates a cost effective glass ceramic inductive individual or array device. Where glass ceramic substrate has demonstrated capability to form such structures through the processing of both the vertical as well as horizontal planes either separately or at the same time to form, two or three-dimensional inductive devices.

The present invention includes a method to fabricate a substrate with one or more, two or three dimensional inductive device by preparing a photosensitive glass substrate and further coating or filling with one or more metals.

A method of fabrication and device made by preparing a photosensitive glass ceramic composite substrate comprising at least silica, lithium oxide, aluminum oxide, and cerium oxide, masking a design layout comprising one or more, two or three dimensional inductive device in the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-crystalline substrate and etching the glass-crystalline substrate with an etchant solution to form one or more angled channels or through holes that are then used in the inductive device.

The present invention provides a method to fabricate an inductive device created in or on photo-definable glass comprising the steps of: preparing a photosensitive glass substrate comprising at least silica, lithium oxide, aluminum oxide, and cerium oxide; masking a design layout comprising one or more structures to form one or more electrical conduction paths on the photosensitive glass substrate; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; etching the glass-crystalline substrate with an etchant solution to form the one or more angled channels in the device; wherein the glass-crystalline substrate adjacent to the trenches may also be converted to a ceramic phase; coating the one or more angled channels with one or more metals; coating all or part of the inductor structure with a dielectric media; removing all or part of the dielectric media to provide electrical contact or free standing inductive device; and wherein the metal is connected to a circuitry through a surface or buried contact.

The inductive device stores current and functions as a current storage device. The one or more metals are designed to operate as an inductor at the appropriate frequencies. The inductive device has a magnetic permeability greater than or equal to copper for frequencies greater than 100 MHz. The inductive device has a magnetic permeability greater than copper for frequencies less than 100 MHz. The ceramic phase can be etched from one side or both sides to partially or fully remove the glass-ceramic material. The method can further include the step of converting at least a portion of the glass into ceramic and etching away the ceramic to at least partially expose the metal structure. The method can further include the step of converting at least a portion of the glass into ceramic and etching away the ceramic to fully expose the metal structure.

The present invention also includes an inductive device having a glass-ceramic material surrounding one or more inductive coils wherein the one or more inductive coils are at least partially surround by air.

The one or more inductive coils include one or more angled channels in the glass-crystalline substrate with a metal coating over at least a portion of the one or more angled channels. The inductive element is further surrounded by a magnetically permeable material. The inductive element does not touch the magnetically permeable material. The inductive element comprises a cavity filled with a magnetically permeable material on one side, both sides or through the glass-ceramic material. The one or more inductors interact with each other. The one or more inductors share a magnetically permeable material. The metal coating may reside partially through, fully through, or on top of the glass-ceramic material, or a combination there of. The inductive device of further includes 1 or more second metal layer on any surface.

The present invention also includes an inductive device having a glass-crystalline substrate surrounding one or more inductive coils wherein the one or more inductive coils are at least partially surround by air. The inductive device includes one or more inductive coils are that are supported by one or more rails on the glass-crystalline substrate. The inductive device includes one or more inductive coils are that are positioned in one or more pits in the glass-crystalline substrate. The inductive device may include a metal coating, a multilayer metal coating, an alloy coating, a multilayer alloy coating.

BRIEF DESCRIPTION OF DRAWINGS

For a more complete understanding of the features and advantages of the present invention, reference is now made to the detailed description of the invention along with the accompanying figures and in which:

FIG. 3A top view of an inductive device in/on APEX® glass.

DESCRIPTION OF INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not restrict the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Figure 1:
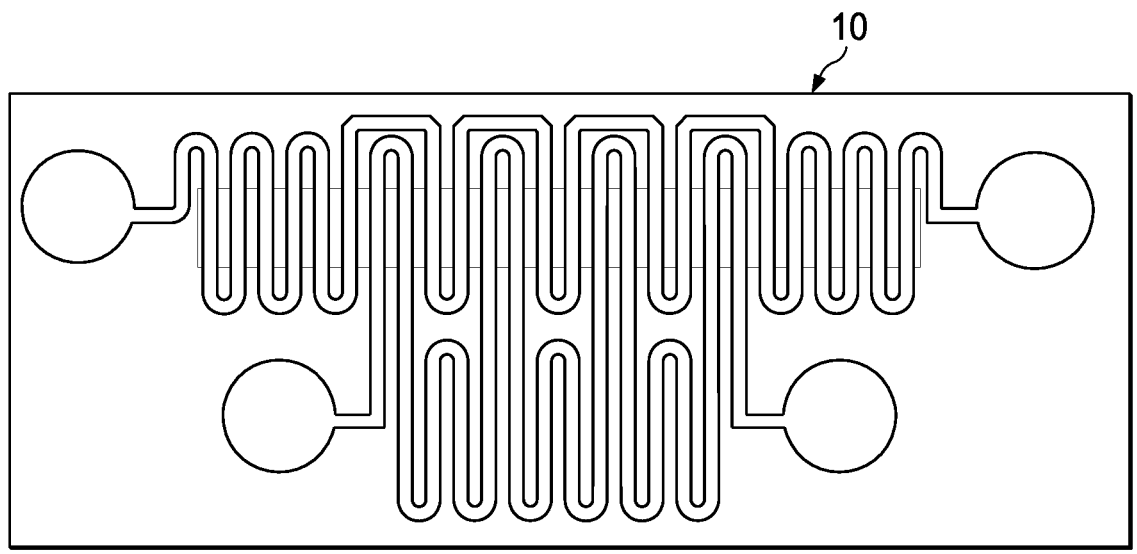
FIG. 1 shows a coreless transformer design.
Figure 2:
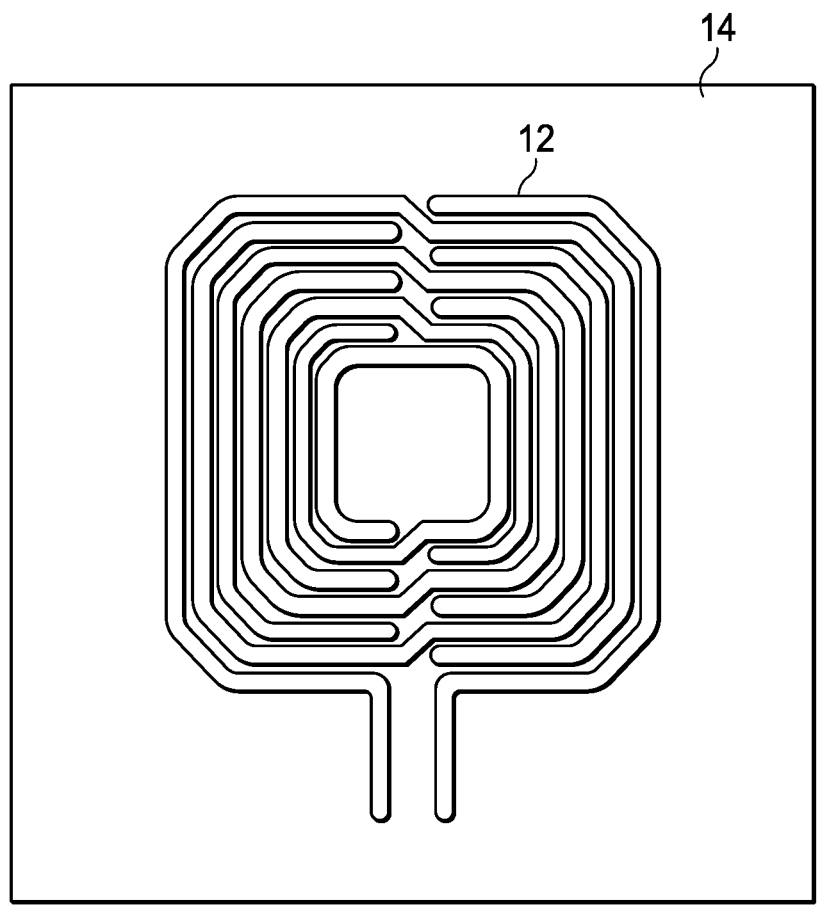
FIG. 2 shows interlocking square spirals etched into APEX® glass.
Figure 3A:
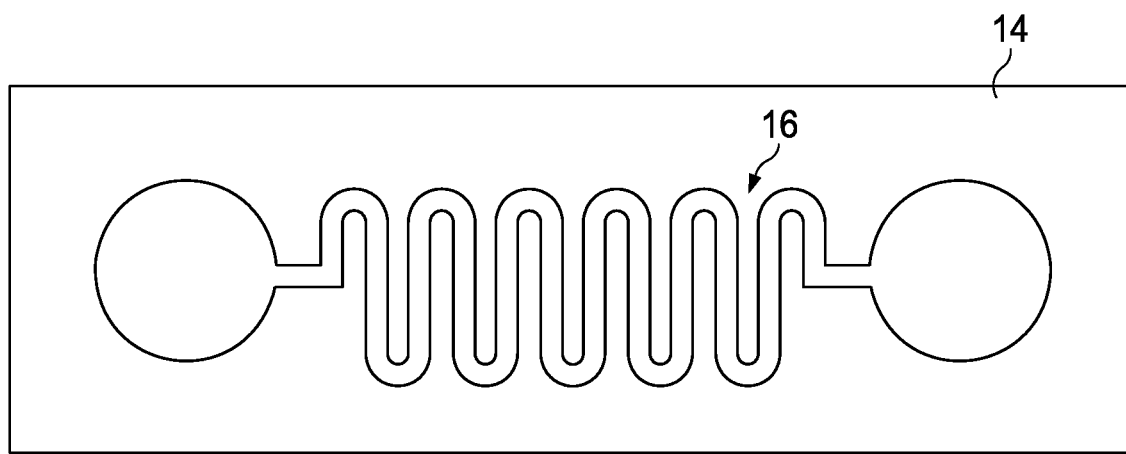
Figure 3B:
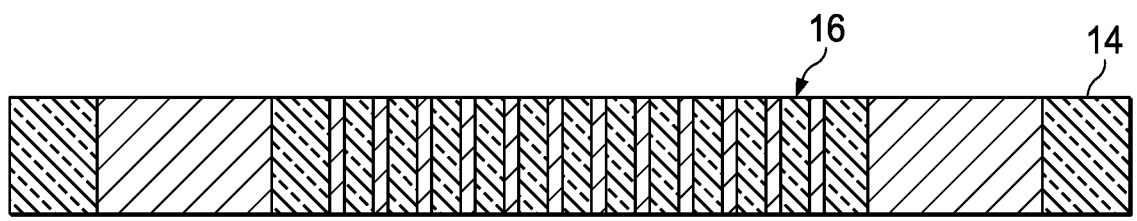
FIG. 3B side view of an inductive device in/on APEX® glass.
Figure 4A:
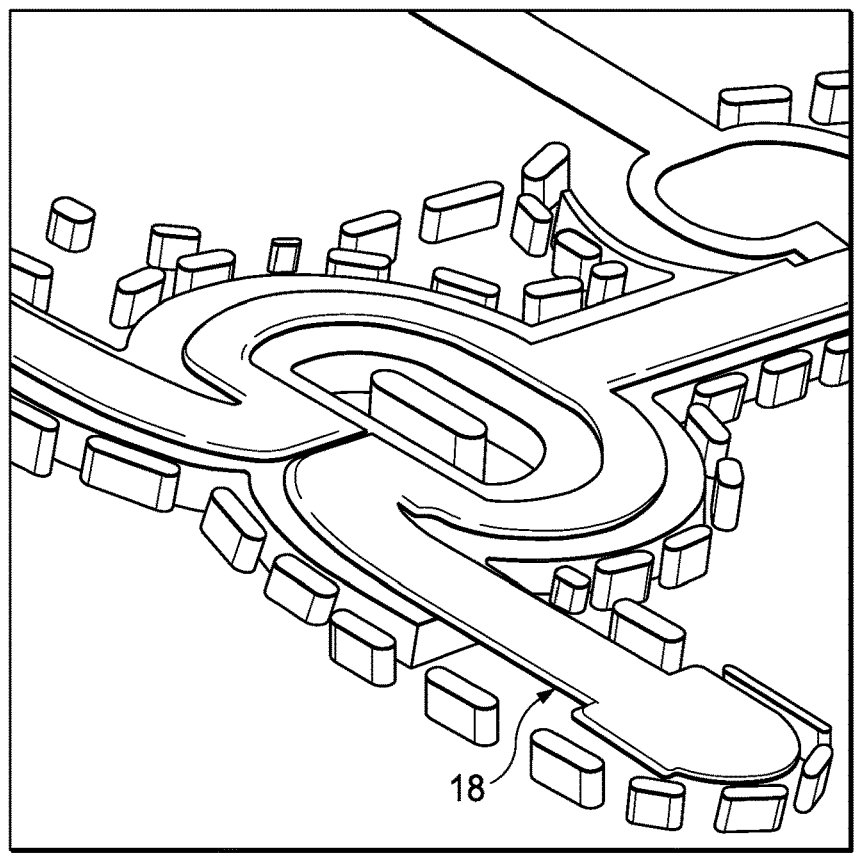
FIG. 4A is an image of a free-standing copper RF antenna bridge structure.
Figure 4B:
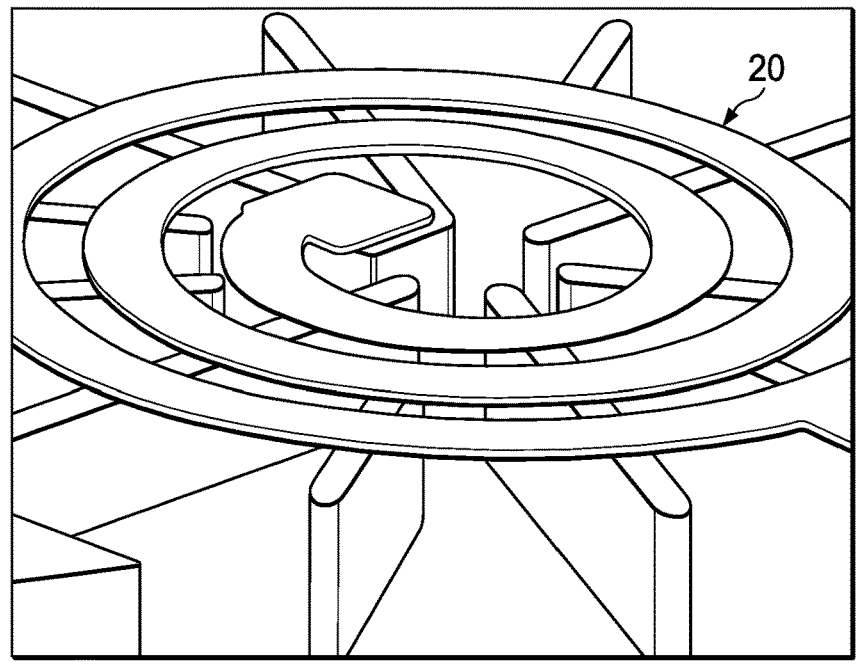
FIG. 4B is an image of a free-standing coil.
Figure 5:
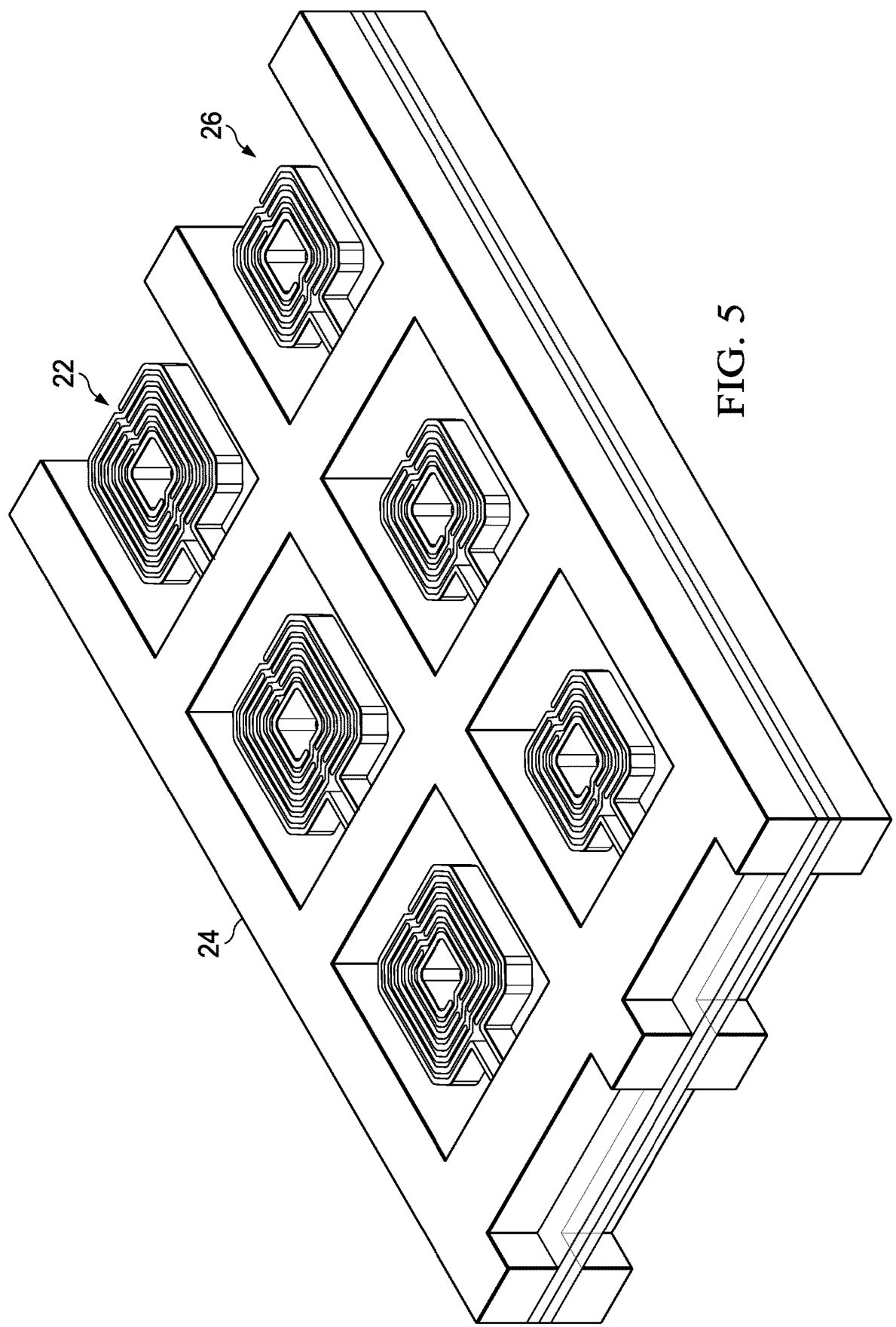
FIG. 5 is an image of a partially etched inductor, where the surrounding ceramic has been partially etched away to allow mostly air to surround the inductive device.
Figure 6:
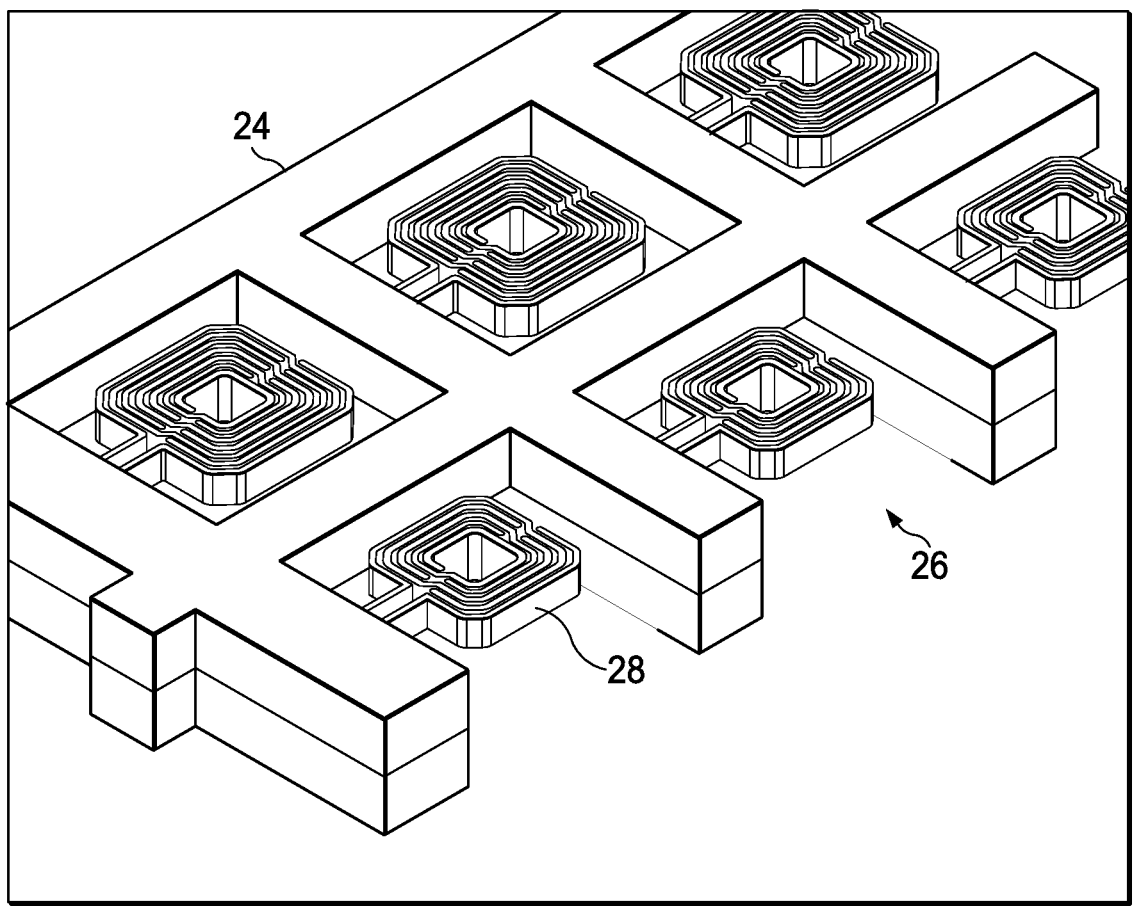
FIG. 6 is an isometric image of a fully etched inductor, where the surrounding ceramic has been fully etched away to allow only air to surround the inductive device.
Figure 7A:
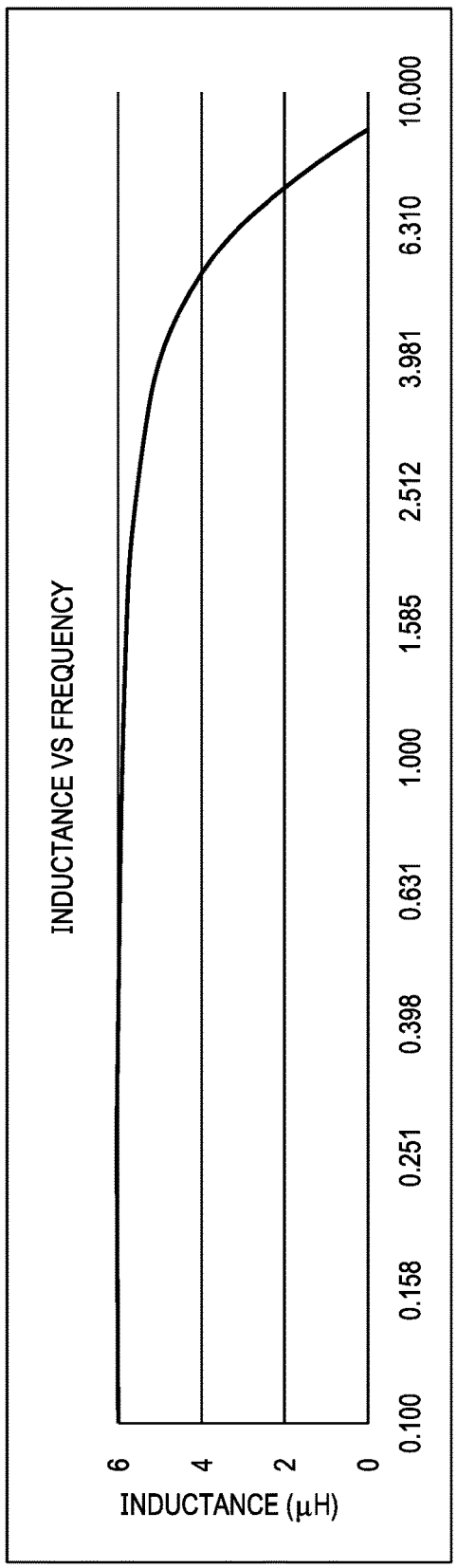
FIGS. 7A and 7B are side image of a fully etched inductor, where the surrounding ceramic has been fully etched away to allow only air to surround the inductive device.
Figure 7B:
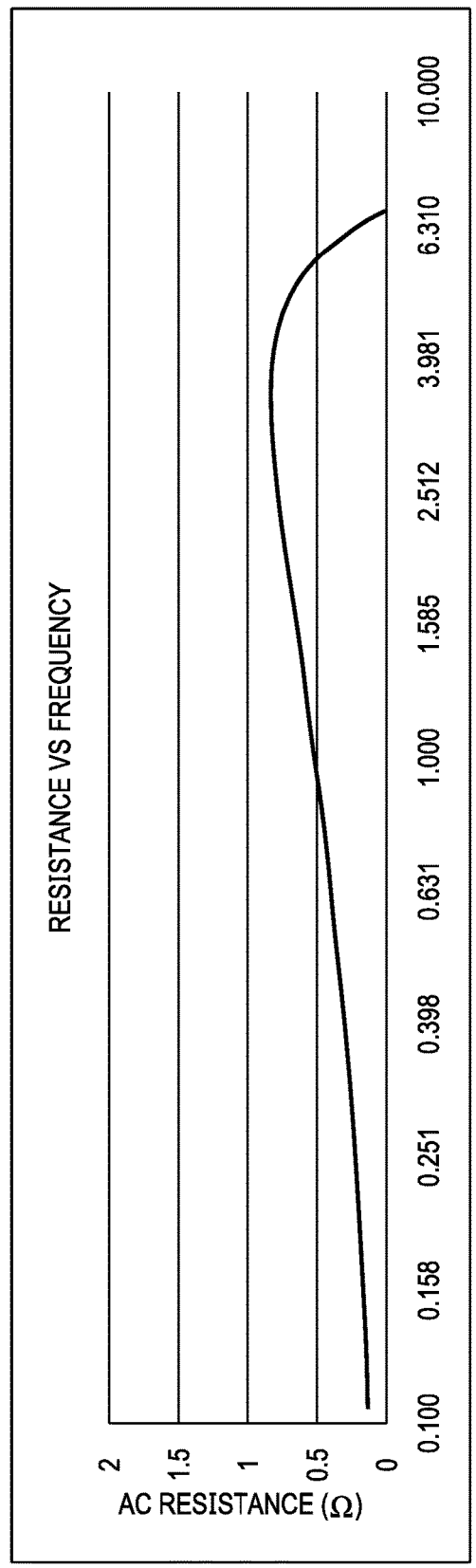

FIG. 1 shows a coreless transformer design. FIG. 2 shows interlocking square spirals etched into APEX® glass. FIG. 3A top view of an inductive device in/on APEX® glass. FIG. 3B side view of an inductive device in/on APEX® glass. FIG. 4A is an image of a free-standing copper RF antenna bridge structure. FIG. 4B is an image of a free-standing coil. FIG. 5 is an image of a partially etched inductor, where the surrounding ceramic has been partially etched away to allow mostly air to surround the inductive device. FIG. 6 is an isometric image of a fully etched inductor, where the surrounding ceramic has been fully etched away to allow only air to surround the inductive device. FIGS. 7A and 7B are side image of a fully etched inductor, where the surrounding ceramic has been fully etched away to allow only air to surround the inductive device.

To address these needs, the present inventors developed a glass ceramic (APEX®) Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic possesses several benefits over current materials, including: easily fabricated high density vias, demonstrated microfluidic capability, micro-lens or micro-lens array, high Young's modulus for stiffer packages, halogen free manufacturing, and economical manufacturing. Photo-etchable glasses have several advantages for the fabrication of a wide variety of microsystems components. Microstructures have been produced relatively inexpensively with these glasses using conventional semiconductor processing equipment. In general, glasses have high temperature stability, good mechanical and electrically properties, and have better chemical resistance than plastics and many metals. To our knowledge, the only commercially available photoetchable glass is FOTURAN®, made by Schott Corporation and imported into the U.S. only by Invenios Inc. FOTURAN® comprises a lithium-aluminum-silicate glass containing traces of silver ions plus other trace elements specifically silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX® glass" or simply "APEX®" is used to denote one embodiment of the glass ceramic composition of the present invention.

When exposed to UV-light within the absorption band of cerium oxide the cerium oxide acts as sensitizers, absorbing a photon and losing an electron that reduces neighboring silver oxide to form silver atoms, e.g.,

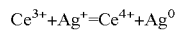

$$Ce^{3+}+Ag^+=Ce^{4+}+Ag^0$$

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference. Preferably, the shaped glass structure contains at least one or more, two or three-dimensional inductive device. The inductive device is formed by making a series of connected loops to form a free-standing inductor. The loops can be either rectangular, circular, elliptical, fractal or other shapes that create and pattern that generates induction. The patterned regions of the APEX® glass can be filled with metal, alloys, composites, glass or other magnetic media, by a number of methods including plating or vapor phase deposition. The magnetic permittivity of the media combined with the dimensions and number of structures (loops, turns or other inductive element) in the device provide the inductance of devices. Depending on the frequency of operation the inductive device design will require different magnetic permittivity materials. At low frequencies, less than 100 MHz devices can use ferrites or other high different magnetic permittivity materials. At higher frequencies >100 MHz high different magnetic permittivity materials can generate eddy currents creating large electrical losses. So at higher frequency operations material such as copper or other similar material is the media of choice for inductive devices. Once the inductive device has been generated the supporting APEX® glass can be left in place or removed to create a free-standing structure. The present invention provides a single material approach for the fabrication of optical microstructures with photo-definable/photopatternable APEX® glass for use in imaging applications by the shaped APEX® glass structures that are used for lenses and includes through-layer or in-layer designs.

Generally, glass ceramics materials have had limited success in microstructure formation plagued by performance, uniformity, usability by others and availability issues. Past glass-ceramic materials have yield etch aspect-ratio of approximately 15:1 in contrast APEX®ß glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX™ Glass ceramic this conversion is closer to 70%. APEX® composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

The present invention includes a method for fabricating a glass ceramic structure for use in forming inductive structures used in electromagnetic transmission, transformers and filtering applications. The present invention includes an inductive structures created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such structures in both the vertical as well as horizontal plane for glass-ceramic substrates. The present invention includes a method for fabricating of an inductive structure on or in a glass ceramic. Ceramicization of the glass is accomplished by exposing the entire glass substrate to approximately 20 J/cm² of 310 nm light. When trying ceramic, users expose all of the material, except where the glass is to remain glass. In one embodiment, the present invention provides a quartz/chrome mask containing a variety of concentric circles with different diameters.

The present invention includes a method for fabricating an inductive device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied compositions are generally referred to as the APEX® glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to create an inductive structure. The mask for the exposure can be of a halftone mask that provides a continuous grey scale to the exposure to form a curved structure for the creation of an inductive structure/device. A digital mask can also be used with the flood exposure and can be used to produce the creation of a inductive structure/device. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1.

Where the material surrounding the inductive device is converted to ceramic before metal filling. Where the metallic material used to fill the etched structures is metal other than copper (i.e. nickel, iron alloys). Where the surface of the inductive device is coated with a dielectric material. Where the surface of the inductive device is patterned first with a dielectric material and then with a patterned metal.

For embodiments that are surrounded by the ceramic phase: Where the ceramic is etched from one side or both sides to partially or fully remove the glass-ceramic material to partially expose the metal structures. An inductive device consisting of multiple unique inductive components. Said device where different inductive components are selectively plated with different metals into different etched features.

The invention claimed is:

1. A method to fabricate an inductive device created in or on photo-definable glass comprising the steps of:
    preparing a photosensitive glass substrate comprising at least silica, lithium oxide, aluminum oxide, and cerium oxide;
    masking a design layout comprising one or more structures to form one or more electrical conduction paths on the photosensitive glass substrate, wherein the one or more structures comprise one or more curved portions;
    exposing at least one portion of the photosensitive glass substrate to an activating energy source;
    exposing the photosensitive glass substrate to a heating phase of at least ten minutes above its glass transition temperature;
    cooling the photosensitive glass substrate to transform at least part of the exposed photosensitive glass substrate to a ceramic phase to form a glass-ceramic material;

etching the glass-ceramic material with an etchant solution to form the one or more structures in the device;

coating the one or more structures with one or more metals;

coating all or part of the one or more metal-filled structures with a dielectric media;

removing all or part of the dielectric media to provide electrical contacts; and wherein the metal is configured to be connected to a circuitry through a surface or buried contact; and wherein the inductive device has a magnetic permeability greater than or equal to copper for frequencies greater than 100 MHz.

2. The method of claim 1, wherein the inductive device stores current and functions as a current storage device.

3. The method of claim 1, wherein the one or more metals are designed to operate as an inductor at selected frequencies.

4. The method of claim 1, further comprising etching the glass-ceramic material from one side or both sides of the glass-ceramic material to partially or fully remove the glass-ceramic material.

5. The method of claim 1, further comprising the step of converting at least a portion of the glass into ceramic and etching away the ceramic to at least partially expose the one or more metal-filled structures or to fully expose the one or more metal-filled structures.

\* \* \* \* \*